(12) United States Patent
Mohr et al.

(10) Patent No.: US 11,437,116 B2
(45) Date of Patent: Sep. 6, 2022

(54) SYSTEM AND METHOD FOR COUNTING FAIL BIT AND READING OUT THE SAME

(71) Applicant: MICRON TECHNOLOGY, INC., Boise, ID (US)

(72) Inventors: Christian N. Mohr, Allen, TX (US); Gregg D. Wolff, Boise, ID (US); Christopher G. Wieduwilt, Boise, ID (US); C. Omar Benitez, Meridian, ID (US); Dennis G. Montierth, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/852,239

(22) Filed: Apr. 17, 2020

(65) Prior Publication Data

US 2020/0243155 A1 Jul. 30, 2020

Related U.S. Application Data

(63) Continuation of application No. 16/020,806, filed on Jun. 27, 2018, now Pat. No. 10,643,734.

(51) Int. Cl.
*G11C 29/44* (2006.01)
*G11C 29/18* (2006.01)
*G11C 16/04* (2006.01)
*G11C 29/56* (2006.01)

(52) U.S. Cl.
CPC .............. *G11C 29/44* (2013.01); *G11C 16/04* (2013.01); *G11C 29/18* (2013.01); *G11C 29/56* (2013.01); *G11C 2029/1802* (2013.01)

(58) Field of Classification Search
None
See application file for complete search history.

(56) References Cited

U.S. PATENT DOCUMENTS

| 4,456,995 | A | | 6/1984 | Ryan |
|---|---|---|---|---|
| 4,479,214 | A | | 10/1984 | Ryan |
| 4,506,364 | A | | 3/1985 | Aichelmann, Jr. et al. |
| 4,584,681 | A | | 4/1986 | Singh et al. |
| 4,876,685 | A | | 10/1989 | Rich |
| 5,233,614 | A | | 8/1993 | Singh |
| 5,281,864 | A | * | 1/1994 | Hahn ............. G01R 31/318541 326/37 |
| 5,568,437 | A | | 10/1996 | Jamal |
| 5,600,658 | A | | 2/1997 | Qureshi |
| 5,717,694 | A | | 2/1998 | Ohsawa |
| 5,912,901 | A | | 6/1999 | Adams et al. |

(Continued)

*Primary Examiner* — J. H. Hur
(74) *Attorney, Agent, or Firm* — Dorsey & Whitney LLP (57) ABSTRACT

An apparatus may include a memory array, a test circuit coupled to the memory array, a counter circuit coupled to the test circuit and an input/output (I/O) circuit coupled to the counter circuit. During a test operation, the test circuit may receive blocks of data from the memory array and compare the data to detect errors in the blocks of data. The counter circuit may increment a count value in response to detection of an error by the test circuit, and the I/O circuit may provide the count value to an output. The test circuit may also provide test comparison data based on the received blocks of data, and the I/O circuit may provide one of the count value and the test comparison data to the output.

8 Claims, 7 Drawing Sheets

(56) References Cited

U.S. PATENT DOCUMENTS

| | | | |
|---|---|---|---|
| 6,175,524 B1 * | 1/2001 | Kwak | G11C 29/38 |
| | | | 365/189.05 |
| 6,408,412 B1 | 6/2002 | Rajsuman | |
| 6,457,141 B1 | 9/2002 | Kim et al. | |
| 6,530,040 B1 * | 3/2003 | Gradinariu | G11C 29/26 |
| | | | 714/42 |
| 7,739,093 B2 | 6/2010 | Beausoleil et al. | |
| 7,895,484 B2 | 2/2011 | Tanaka et al. | |
| 10,643,734 B2 | 5/2020 | Mohr et al. | |
| 2002/0008984 A1 * | 1/2002 | Keeth | G11C 29/12 |
| | | | 365/51 |
| 2002/0024352 A1 | 2/2002 | Sim | |
| 2002/0178412 A1 * | 11/2002 | Matsui | G11C 29/48 |
| | | | 714/718 |
| 2003/0051197 A1 * | 3/2003 | Evans | G11C 29/12 |
| | | | 714/718 |
| 2005/0138509 A1 | 6/2005 | Kiryu et al. | |
| 2007/0136623 A1 | 6/2007 | Perego et al. | |
| 2007/0234154 A1 * | 10/2007 | Whetsel | G01R 31/3172 |
| | | | 714/727 |
| 2012/0221903 A1 * | 8/2012 | Ohnuma | G11C 29/56004 |
| | | | 714/720 |
| 2016/0055056 A1 * | 2/2016 | Son | G06F 11/1008 |
| | | | 714/764 |
| 2017/0060657 A1 * | 3/2017 | Healy | G06F 11/076 |

* cited by examiner

SYSTEM AND METHOD FOR COUNTING FAIL BIT AND READING OUT THE SAME

CROSS REFERENCE TO RELATED APPLICATION

This application is a continuation of U.S. patent application Ser. No. 16/020,806, filed Jun. 27, 2018 and issued as U.S. Pat. No. 10,643,734 on May 5, 2020. These application and patent are incorporated by reference herein in their entirety and for all purposes.

BACKGROUND

During production, memory devices are often tested at several stages prior to shipment to ensure that they meet quality standards and specifications. Various testing technologies may be used to test memory to determine whether the memory meets the desired specifications. However, current pre-shipment testing methods of memory devices are limited to pass/fail determinations with no further indication of the prevalence or severity of the failures. Existing testing technologies are limited in provision of any assessment of the degree or prevalence of errors in a memory device. That is, if the memory device does not pass a given test, the failed device may be entirely discarded even though the failed memory device may be suitable for some applications.

BRIEF DESCRIPTION OF THE DRAWINGS

The present solution will be described with reference to the following figures, in which like numerals represent like items throughout the figures.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
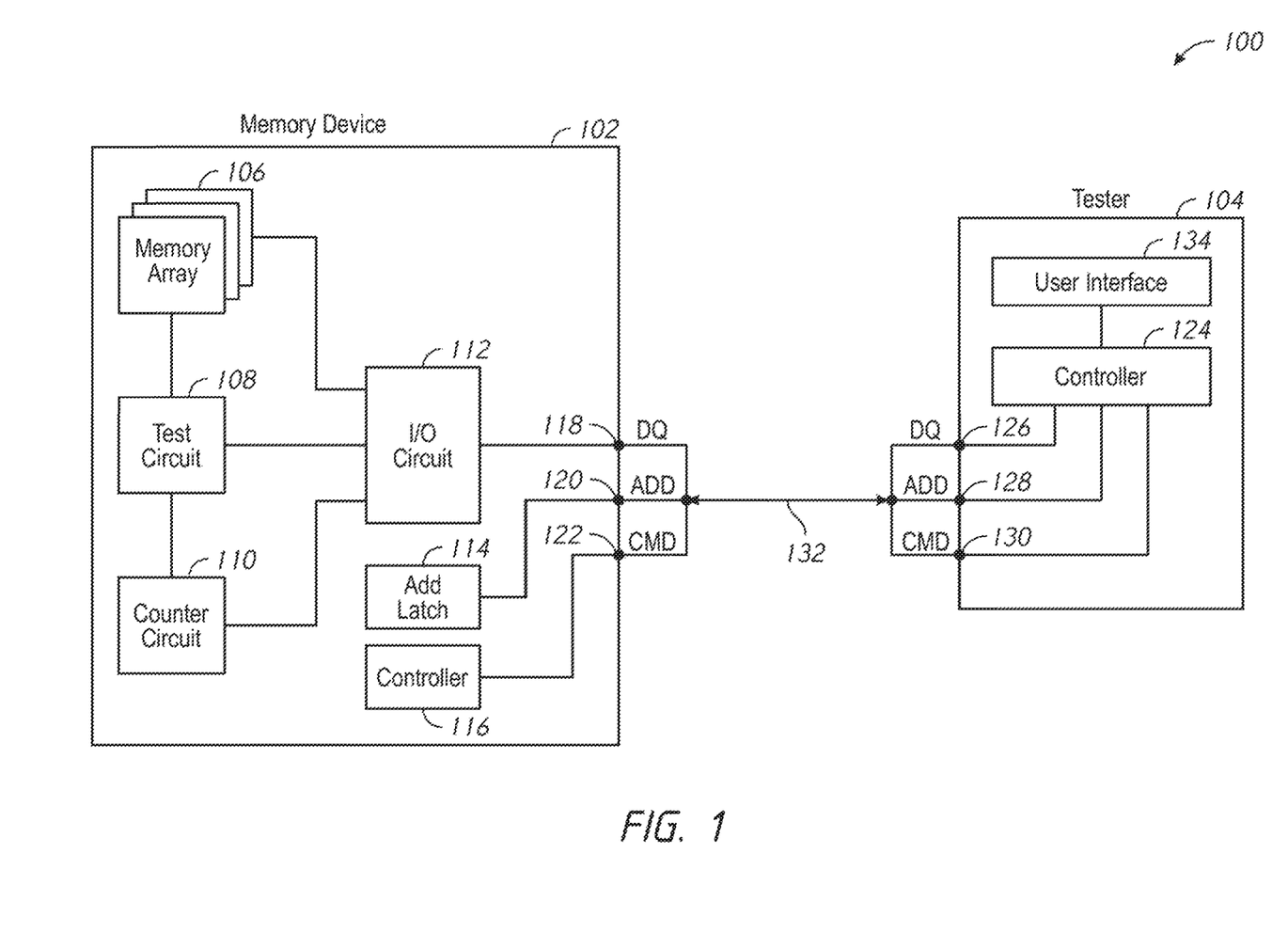
FIG. 1 illustrates a schematic block diagram of an example system for testing a semiconductor device in accordance with some examples disclosed herein.

FIG. 1 illustrates a schematic block diagram of an example system 100 in accordance with some examples disclosed herein. The system 100 may include a memory device 102. For example, memory device 102 may include a memory array that includes one or more memory cells 106, an address latch 114 and a command controller 116. Memory device 102 may also include one or more data (DQ) terminals 118, one or more address terminals 120 and one or more command terminal 122. One or more data terminals 118 may be coupled to the memory array 106 for reading/writing data. One or more address terminals 120 may be coupled to an address latch for providing an address to a particular memory cell. One or more command terminals 122 may be coupled to the command controller which controls the timing of control signals for writing/reading data to/from a particular memory cell in the memory array 106.

Additionally, memory device 102 may include a test circuit 108 that is coupled to the memory array. Test circuit 108 may be configured to perform a test operation. In performing the test operation, test circuit 108 may be configured to receive blocks of data read from the memory array 106 and provide test comparison data based on the received blocks of data. Each block of data may be responsive to a respective memory access. Each block of read data my include data from a plurality of memory cells of the memory array 106, such as data from 16, 32, 64, 128, or more memory cells. The test comparison data provided by the test circuit 108 may indicate detection of at least one error among the received blocks of data in the aggregate. For example, the test circuit 108 may set the test command data to indicate an error in response to detection of an error in any of the blocks of data. In some examples, the test circuit 108 may detect errors by iteratively performing comparisons between consecutive blocks of data (e.g., comparing a second block to a first block, comparing a third block to the second block, etc.). In some examples, the comparisons may include bitwise comparisons of the bits of the consecutive blocks of data (e.g., using XNOR logic or using compression testing). In response to a first detected error between consecutive blocks of data, the test circuit 108 generates the test comparison data. The test comparison data may provide a pass/fail indication that can be latched persistently or output in a bitwise read fashion. In other examples, the comparisons may include comparisons of the block of data with extrinsic (e.g., external) expected bit values.

However, while the test comparison data may be set to indicate presence of an error within the blocks of data, it may be limited in an ability to indicate a number of blocks that included errors, and therefore is limited in an ability to provide an indication of a total number of errors in the memory device 102. In some scenarios, memory 102 may also include a counter circuit 110. Counter circuit 110 may be coupled to the test circuit 108. During test operation, the counter circuit 110 may be configured to increment a count value in response to detection of an error by the test circuit 108 based on a comparison result signal. The test circuit 108 may provide the comparison result signal to the counter circuit 110 to indicate when error is detected. In some examples, the detected error may be at a block level (e.g., limited to one error count per block comparison). In other examples, the detected error may be at a sub-block level, such as an individual bit level (e.g., counts each bit error in a given block of data) or a subset of bits (e.g., counts each error in a given group of bits of the block of data). The counter circuit 110 may be configured to provide the count value to an input/output (I/O) circuit 112. Memory device 102 may include the I/O circuit 112 that provides at least one of a count value from the counter circuit 110 or at least a portion of the test comparison data from the test circuit 108 to an output, e.g., the one or more data terminals 118. In some scenarios, I/O circuit 112 may be a data steering logic. For example, the I/O circuit 112 may include a multiplexing circuit which can be configured to read out data from the memory array 106 to the output.

With further reference to FIG. 1, the system 100 may include a tester 104 that is configured to receive data or test results from the memory device 102. In some scenarios, tester 104 may be coupled to memory device 102, for example, via a communication bus 132. In some scenarios, communication bus 132 may include at least one of a data bus or a command bus or an address bus. Tester 104 may also include one or more data terminals 126, one or more address terminals 128, and/or one or more command terminals 130. Tester 104 may also include a controller 124 that is coupled to one or more of the data terminals 126, address terminals 128 and command terminals 130. Controller 124 may be configured to receive or send data, address or command from/to the memory device 102 via the communication bus 132. For example, during test operation of the memory device 102, the tester 104 may be configured to send test data to be written to the memory arrays 106 of the memory device 102 via the communication bus 132 and via the one or more data terminals 118. The tester 104 may be configured to initiate a read of some or all of the memory cells of the memory array 106 to which the test data was written to determine whether the memory device 102 meets a desired specification or standard. The test data read request may be provided via the communication bus 132. The tester 104 may receive the test comparison data from the I/O circuit 112 via the one or more data terminals 118 and via the communication bus 132 to determine whether the memory device 102 has passed a test. The tester may further receive the counter value from the I/O circuit 112 via the one or more data terminals 118 and via the communication bus 132. The memory device 102 with the counter circuit 110 may provide more detailed information regarding failure of the memory device 102. The additional detail may be used to analyze whether the memory device 102 may be suitable for another application that has different standards or specifications.

In some scenarios, tester 104 may include a user interface 134 coupled to the controller to receive data, e.g., the error count value read from the memory device. User interface 134 may include any suitable device for outputting data, such as a display (e.g., a LCD screen, one or more LED lights) or an audio output (e.g., a speaker). User interface 134 may also be configured to receive one or more user commands for causing controller 124 to configure the test operation. For example, user interface 134 may receive a user command to re-run a memory test. Controller 124 receives the user command and subsequently sends a command via the communication bus 132 to memory device 102. Upon receiving the command, memory device 102 may re-run the memory test and output the error counter from the counter circuit 110, via the I/O circuit 112.

Figure 2:
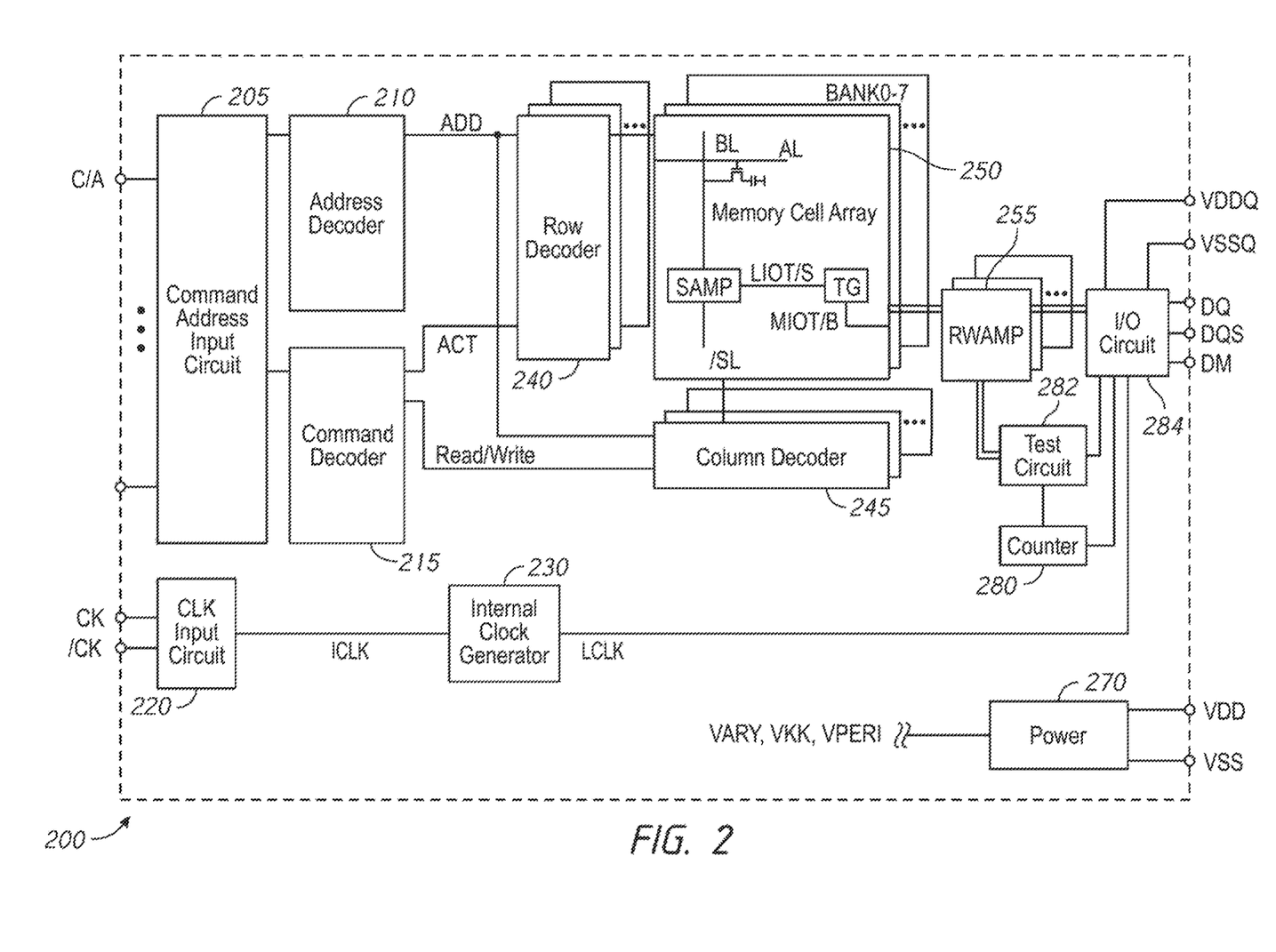
FIG. 2 illustrates a schematic block diagram of an example of a memory device in accordance with some examples disclosed herein.

FIG. 2 illustrates a schematic block diagram of an example of a memory device in accordance with some examples disclosed herein. In some scenarios, a semiconductor device 200 may include a memory die. The memory die may include a command/address input circuit 205, an address decoder 210, a command decoder 215, a clock input circuit 220, internal clock generator 230, row decoder 240, column decoder 245, memory arrays 250, read/write amplifiers 255, I/O circuit 284, and power circuit 270.

In some examples, semiconductor device 200 may include, without limitation, a dynamic random-access memory (DRAM) device, such as double data rate (DDR) DDR4, DDR5, low power DDR (LPDDR), integrated into a single semiconductor chip, for example. The die may be mounted on an external substrate, for example, a memory module substrate, a mother board or the like. The semiconductor device 200 may further include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SA) are located for their corresponding bit lines BL and connected to at least one respective local I/O line (LIOT/B), which is in turn coupled to a respective one of at least two main I/O line pairs (MIOT/B), via transfer gates (TG), which function as switches.

When an access operation is performed, the sense amplifiers sense a voltage difference between a BL to which an accessed memory cell (and the sense amplifier) is coupled and a reference voltage, and amplify the difference. The sense amplifiers may use the other BL to which the sense amplifier is coupled to provide the reference voltage. In some scenarios, the sense amplifiers adjacent to a border of the memory array 250 may be coupled to a one bit line BL segment and to a load segment rather than being coupled to (e.g., between) two bit line BL segments. The load segment may be used as a reference segment to provide the reference voltage when reading the one bit line segment. In some examples, the load segments may include circuitry configured to approximate the capacitance of a bit line BL segment. For example, the load segments may include capacitors or other circuitry that adds a capacitance load to the load segment. In some examples, the load segment may include tunable circuitry that is configured to adjust the capacitance of the load segment. During an initial setup or during an initialization process, the tunable circuitry may selectively activate or connect load circuitry by selectively providing a reference voltage to the load circuitry or selectively adjusting the reference voltage in order to adjust a capacitance of the load segment. In some examples, the load circuitry may include metal-oxide semiconductor field-effect transistors (MOSFETs) that are operated in a diode configuration.

Semiconductor device 200 may employ one or more external terminals that include address and command terminals coupled to command/address bus (C/A), clock terminals CK and/CK, data terminals DQ, DQS, and DM, power supply terminals VDD, VSS, VDDQ, and VSSQ.

The command/address terminals may be supplied with an address signal and a bank address signal from outside. The address signal and the bank address signal supplied to the address terminals are transferred, via the command/address input circuit 205, to an address decoder 210. The address decoder 210 may receive the address signal and decode the address signal to provide decoded address signal ADD. The ADD signal may include a decoded row address signal and a decoded column address signal. The decoded row address signal is provided to the row decoder 240, and a decoded column address signal may be provided to the column decoder 245. The address decoder 210 may also receive the bank address signal and supplies the bank address signal to the row decoder 240, the column decoder 245.

The command/address terminals may further be supplied with a command signal from outside, such as, for example, a memory controller. The command signal may be provided, via the C/A bus, to the command decoder 215 via the command/address input circuit 205. The command decoder 215 decodes the command signal to generate various internal commands that include a row command signal ACT to select a word line and a column command signal Read/Write, such as a read command or a write command, to select a bit line, and a test mode signal.

Accordingly, when a read command is issued and a row address and a column address are timely supplied with the read command, read data is read from a memory cell in the memory array 250 designated by these row address and column address. The read data is output to outside from the data terminals DQ (data) and DQS (data strobe), via read/write amplifiers 255 and an input/output (IO) circuit 284. Similarly, when the write command is issued and a row address and a column address are timely supplied with this command, and then write data is supplied to the data terminals DQ, DQS, DM, the write data is received by data receivers at the I/O circuit 284 and supplied via the I/O circuit 284 and the read/write amplifiers 255 to the memory array 250 and written in the memory cell designated by the row address and the column address.

Turning to the external terminals included in the semiconductor device 200, the clock terminals CK and /CK may be supplied with an external clock signal and a complementary external clock signal, respectively. The external clock signals (including complementary external clock signal) may be supplied to a clock input circuit 220. The clock input circuit 220 may receive the external clock signals to generate an internal clock signal ICLK. The internal clock signal ICLK may be supplied to an internal clock generator 230 and thus a phase controlled internal clock signal LCLK is generated based on the received internal clock signal ICLK. In some non-limiting examples, a delay-locked loop (DLL) circuit, a duty cycle correction (DCC) circuit, or a combination thereof may be used as the internal clock generator 230. The phase controlled internal clock signal LCLK may be supplied to the input/output circuit 284 and used as a timing signal for determining an output timing of read data.

The power supply terminals are supplied with power supply potentials VDD and VSS. These power supply potentials VDD and VSS are supplied to an internal voltage generator circuit 270. The internal voltage generator circuit 270 may generate various internal potentials VARY, VKK, VPERI, and the like based on the power supply potentials VDD and VSS. The internal potential VARY may be used in the sense amplifiers included in the memory array 250, the internal potential VKK may be used in the row decoder 240, and the internal potential VPERI may be used in many other circuit blocks.

The power supply terminals may also be supplied with power supply potentials VDDQ and VSSQ. These power supply potentials VDDQ and VSSQ are supplied to the I/O circuit 284. The power supply potentials VDDQ and VSSQ are typically the same potentials as the power supply potentials VDD and VSS, respectively. However, the dedicated power supply potentials VDDQ and VSSQ are used for the I/O circuit 284 so that power supply noise generated by the I/O circuit 284 does not propagate to the other circuit blocks.

With further reference to FIG. 2, semiconductor device 200 may also include a test circuit 282 and a counter circuit 280 configured to provide test comparison data and a count value, respectively, to the I/O circuit 284. The I/O circuit 284 may include circuitry to select for output one of read data from the read/write amplifiers 155, the test comparison data from the test circuit 282, or the count value from the counter circuit 280. In some examples, the read data from the read/write amplifiers may be provided during normal operation. In some examples, the test comparison data from the test circuit 282 and/or the count value 280 from the count circuit 280 may be provided during a test operation. In some examples, the counter circuit 280 output may be accessed directly on the semiconductor device 200, such as via a tester (e.g., the tester 104 of FIG. 1) connected to a port of the semiconductor device 200.

The test circuit 282 may be coupled to read/write amplifiers 255 to receive blocks of read data from the memory array 250 during test operations. In some examples, test circuit 282 may be configured to receive the blocks of read data directly from the memory array 250. The test circuit 282 may be configured to detect errors in the blocks of read data during the test operation, and provide test comparison data to the I/O circuit 284 based on the detection of errors, which may be communicated to a tester via a communication bus (e.g., the communication bus 132 in FIG. 1. In some examples, the test circuit 108 may detect errors by iteratively performing comparisons between consecutive blocks of data (e.g., comparing a second block to a first block, comparing a third block to the second block, etc.). In some examples, the comparisons may include bitwise comparisons of the bits of the consecutive blocks of data (e.g., using XNOR logic or using compression testing). In response to a first detected error between consecutive blocks of data, the test circuit 108 sets the test comparison data. The test comparison data may remain set for the remainder of the iterative consecutive block comparisons or may be monitored on each block comparison cycle. Thus, the test comparison data is a pass/fail indication. The test circuit 282 may include one or more logic gates, e.g., XOR gates, AND gates and/or OR gates, XNOR gates, or other suitable logic gates that perform the comparison of the test data, and generate test comparison data.

During test operation, the counter circuit 280 may be configured to increment a count value in response to detection of an error by the test circuit 282. The test circuit 282 may provide a signal to the counter circuit 280 that indicates when error is detected. In some examples, the detected error may be at a block level (e.g., limited to one error count per block of data). In other examples, the detected error may be at a sub-block level, such as an individual bit level (e.g., counts each bit error in a given block of data) or a subset of bits (e.g., counts each error in a given group of bits of the block of data). The counter circuit 280 may be configured to provide the count value to the I/O circuit 284. In some examples, the comparison is an intrinsic comparison of the read data, such as a bit-wise XOR comparisons of the bits of the read data.

In some examples, the testing may include multiple iterative memory test runs, with each iteration covering a portion (e.g., block) of the memory array 250. For example, with a compression test having a ratio of 32:1, each test run may include testing of 4 bytes of memory and the output of the test circuit 282 may include one bit. Each of the subsequent test runs may move to the next 4 bytes of the memory, so on and so forth. In each test run, the counter circuit 280 may be configured to accumulate the error counts from multiple test runs performed in the test circuit 282. For example, the counter circuit 280 may be configured to increment a count value in response to each error detected by the test circuit 282. At any time during or at the completion of the test, the count value of the counter circuit 280 or at least a portion of the test comparison data may be read out via the I/O circuit 112 as described in FIG. 1.

Figure 3:
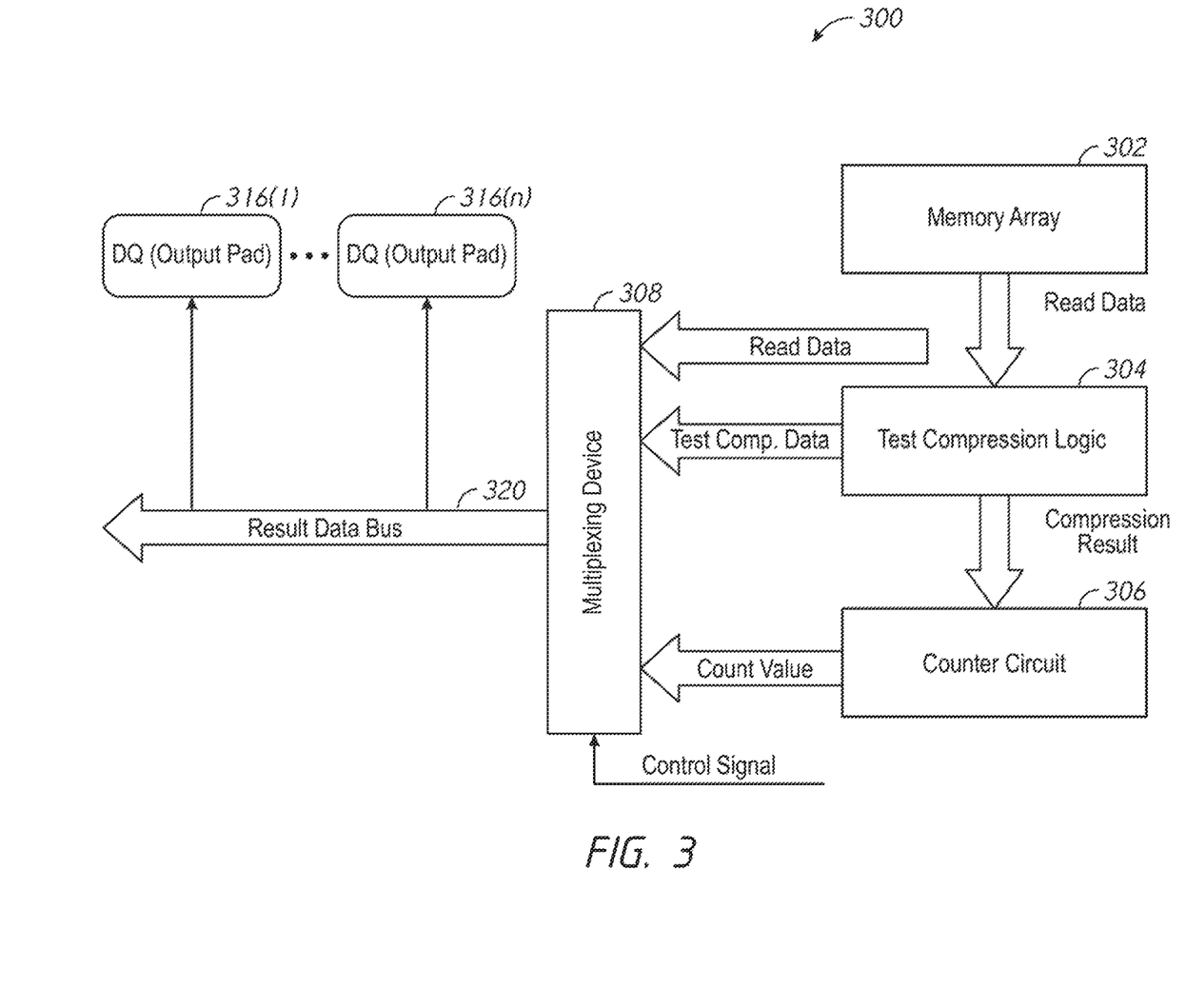
FIG. 3 illustrates a block diagram of a portion of a memory device in accordance with some examples disclosed herein.

FIG. 3 illustrates a block diagram of a portion of a semiconductor device 300 in accordance with some examples disclosed herein. The semiconductor device 200 in FIG. 2 may implement the semiconductor device 300 of FIG. 3. In some scenarios, the semiconductor device 300 may include a memory array 302, test compression logic 304 coupled to the memory array 302. Test compression logic 304 may be configured to receive blocks of read data from the memory array 302 and perform certain logic functions over the received data and generate test compression data. The semiconductor device 300 may also include a counter circuit 306 coupled to the test compression logic 304 to receive the comparison result signal. In some scenarios, the comparison result signal may include a single succeed/fail bit. The semiconductor device 300 may also include a multiplexing device 308, a result data bus 320 coupled to the multiplexing device 308, and one or more data output pads 316(1)-316(n) coupled to the result data bus 320. The multiplexing device 308 may be configured to feed to the result data bus at least one of: the read data, the test comparison data, and the count value. In some scenarios, the count value may be stored in a multi-purpose register (MPR). In some examples, contents of the MPR may be accessed directly, such as via a tester (e.g., the tester 104 of FIG. 1) connected to a port of the semiconductor device 300.

In operation, the test compression logic 304 may be configured to detect errors in blocks of data read from the memory array 302 using compression testing. Compression testing may include iterative block comparisons between consecutive blocks of read data (e.g., comparing a second block to a first block, comparing a third block to the second block, etc.) to detect whether a block of read data includes an error. In some examples, the comparisons may include bitwise comparisons of the bits of the consecutive blocks of data (e.g., using XNOR logic). In response to a first detected error between consecutive blocks of data, the test compression logic 304 sets the test comparison data. The test comparison data may remain set for the remainder of the iterative consecutive block comparisons or may be monitored on each block comparison cycle. Thus, test compression logic 304 provides a single pass/fail indication of whether the memory array 302 failed the test during the test operation via the test comparison data. The test compression logic 304 provides the test comparison data to the multiplexing device 308. The test compression logic 304 may include one or more logic gates, e.g., XNOR gates, XOR gates, AND gates and/or OR gates or other suitable logic gates that perform the comparison of the test data, and generate test comparison data. However, the test compression logic 304 may further provide a comparison result from each consecutive block comparison to the counter circuit 306.

The counter circuit 306 may be configured to increment a count value in response to detection of an error by the test compression logic 304 based on the comparison result signal. In some examples, the detected error may be at a block level (e.g., limited to one error count per block of data). In other examples, the detected error may be at a sub-block level, such as an individual bit level (e.g., counts each bit error in a given block of data) or a subset of bits (e.g., counts each error in a given group of bits of the block of data). The counter circuit 306 may be configured to provide the count value to the multiplexer device 308.

Figure 4:
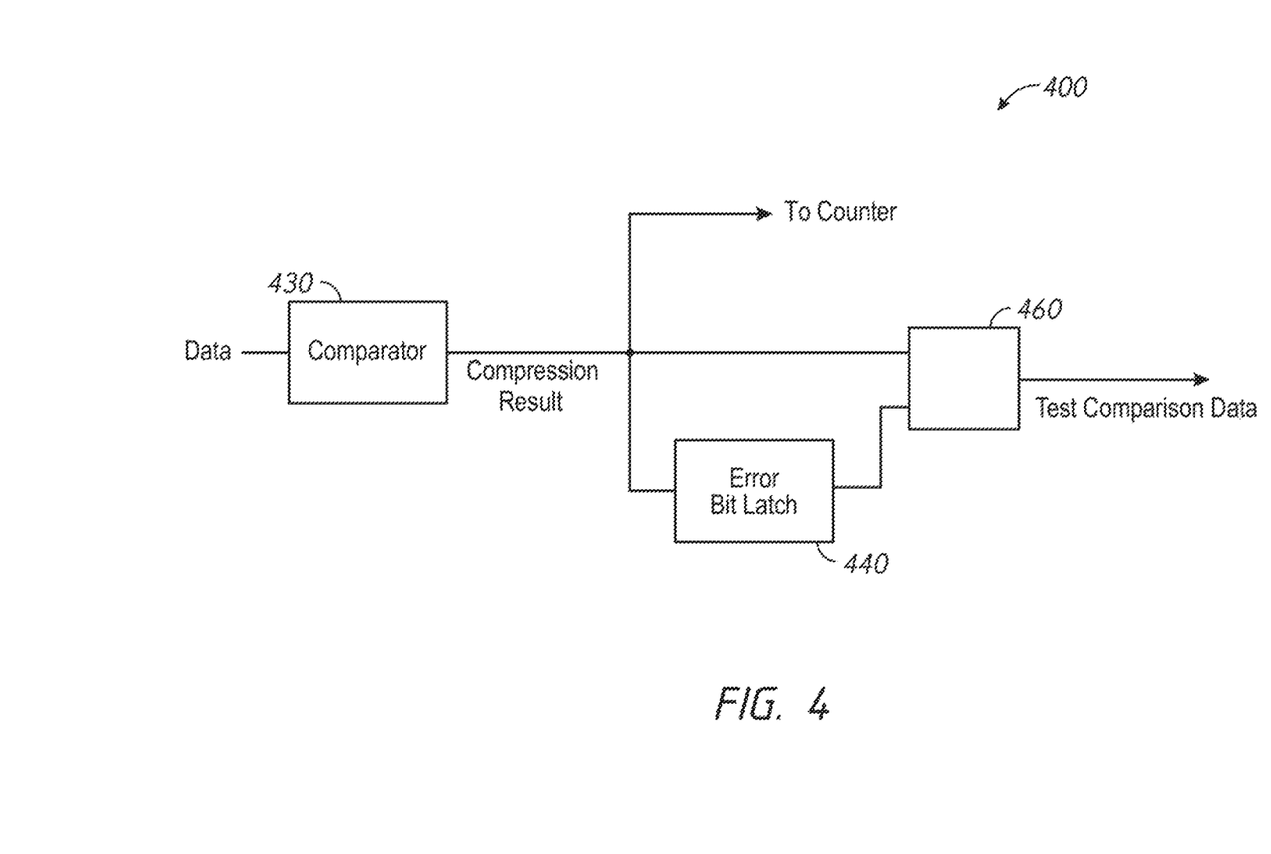
FIG. 4 illustrates a schematic block diagram of a compression circuit in accordance with some examples disclosed herein.

FIG. 4 illustrates a schematic block diagram of a compression circuit 400 in accordance with some examples disclosed herein, which the test circuit 108 of FIG. 1, the test circuit 282 of FIG. 2, and/or the test compression logic 304 of FIG. 3 may implement. In some scenarios, compression circuit 400 may include a comparator 430 (e.g., a comparison circuit) that receives and compares data from memory arrays responsive to one or more memory accesses.

In some scenarios, the comparator 430 may compare data read from a memory array using one or more logic gates, such as XNOR gates. The comparison, for example, may be a bitwise comparison using an XNOR gate. Examples of the comparator are described herein with reference to 108 in FIG. 1, 282 in FIGS. 2 and 304 in FIG. 3. The comparator 430 provides a comparison result having a value that is indicative of whether an error is detected in a read operation of the memory. For example, the comparison result at the output of comparator 430 may be a single-bit result that represents a pass or a fail, e.g., a logic high or logic low.

In some scenarios, the circuit 400 may be configured to send the compression result to a counter, which may increment in response to the error bit provided from the comparator indicating an error, which in some examples, may indicate a count of read operations that failed. Examples of the counter 420 are described herein with reference to 110 in FIG. 1, 280 in FIGS. 2 and 306 in FIG. 3.

In some scenarios, the compression circuit 400 may include an error bit latch 440 coupled to the comparator 430 and configured to receive the compression result, which indicates that an error in the data is detected. In some examples, the compression circuit 400 may include a multiplexing device 460, the input of which may be coupled to the output of the comparator 430 and the output of the error bit latch 440. The error bit latch 440 may set the test comparison data to an error detected state. The test comparison data may be provided to an I/O circuit such as I/O circuit 112 of FIG. 1, I/O circuit 280 of FIG. 2, and/or multiplexing device 308 in FIG. 3. The multiplexing device 460 may be configured to receive a control signal indicating whether to output a persistent output or a bit-wise output. In some examples, the multiplexing device 460 may be configured to produce a persistent output. In such case, for example, if the compression result indicates that there is an error detected, the error bit latch 440 latches and maintains that error detected state. In other words, a state of the compression result latched at the error bit latch 440 may remain unchanged responsive to a successful read operation, and this state may be sent to the I/O circuit via multiplexing device 460.

In some scenarios, the multiplexing device 460 may be configured to output a bit-wise output, e.g., to send the error state in the compression result in every memory access. In operation, in some scenarios, in response to sequential receipt and execution of a plurality of memory access commands (e.g., a first memory access command, second memory access command, third memory access command, etc.), such as read commands, corresponding read data (e.g., first read data, second read data, third read data, etc.) comparison for each of the plurality of memory access commands may be sequentially received at the comparator 430. Each corresponding read data may include a plurality of bits. For each read data, the comparator 430 generates a corresponding test comparison data (e.g., first comparison data, second comparison data, third comparison data, etc.). In some examples, the comparator 430 uses XOR logic to compresses the plurality of bits of a read data into a single test comparison data bit. The multiplexing device 460 sequentially receives and sends the result to an output as test comparison data. The test comparison data is provided to indicate whether any of the memory cells in a group of memory cells from which the corresponding read data was provided (e.g., associated with a particular repair address) failed.

In the specific, non-limiting example described with reference to FIGS. 1-3, the data compression circuit 400 may receive, in parallel, 8, 16, 32, 64, 128 or any suitable number of data bits, where each set of bits is received responsive to a respective (e.g., corresponding) memory access. The comparator 430 may compresses each set of bits into a single compression result. The error bit latch 440 may latch the compression result as the output test comparison data bit having the error detected state having a value indicating the detection of an error in the set of bits. Further related to the specific non-limiting example described with reference to FIG. 1, FIG. 2, and FIG. 3, test circuit 108 of FIG. 1, test circuit 282 of FIG. 2, and/or test compression logic 304 of FIG. 3 may include multiple data compression circuits 400, one for each of the multiple 10 channels. For example, the test circuit may include 128 compression circuits, each corresponding to one of 128 IO channels.

The data compression circuit 400 may be modified to latch more than one bit prior to performing a comparison at the comparator 430, and that the comparator 430 may be modified to generate more than two bits. Further, more than 128 or less than 8 bits of data can be compressed into a single error bit. In some examples, the number of data bits that are compressed may depend on the configuration (e.g., number of columns wide) of the redundancy memory elements for a group. In some scenarios, data compression circuit 400 may compress each bit corresponding to a respective group into a single error bit, where each bit of the respective group is retrieved responsive to a respective memory access in a plurality of sequential memory accesses.

Figure 5:
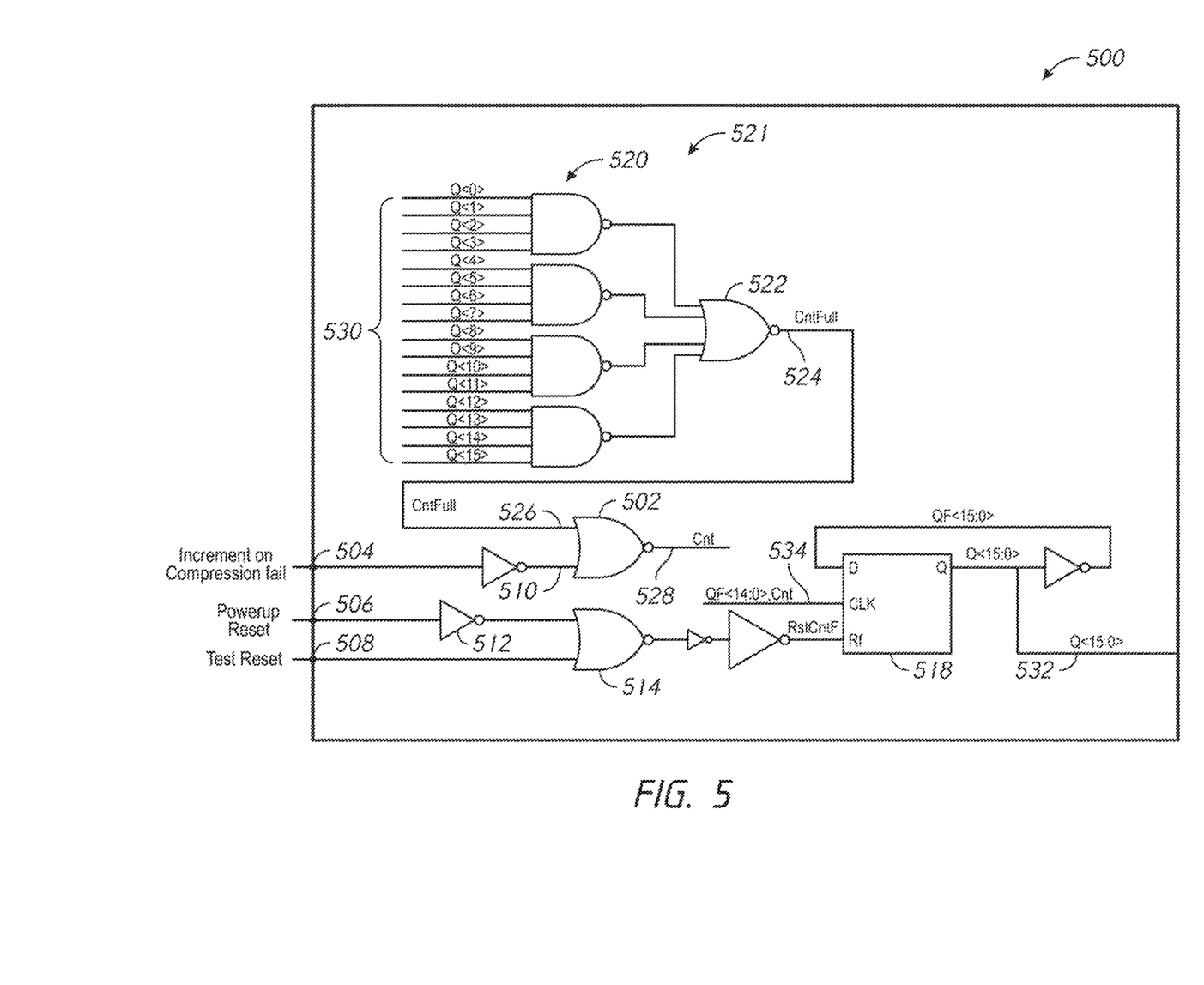
FIG. 5 illustrates a schematic block diagram of a counter circuit in accordance with some examples disclosed herein.

FIG. 5 illustrates a schematic block diagram of a counter circuit 500 in accordance with some examples disclosed herein. The counter circuit 110 of FIG. 1, the counter circuit 280 of FIG. 2, the counter circuit 306 of FIG. 3, or combinations thereof, may implement the counter circuit 500. In some scenarios, counter circuit 500 may include a counter 518 having an output 532. For example, one or more flip-flops may be configured as the counter 518 and coupled to the output 532 of that counter. In a non-limiting example, the counter 518 may include a ripple counter that includes multiple flip-flops, each corresponding to one bit of the count value at the output 532. For example, the output of the counter 518 may include 16 bits. The clock line of each of the flip-flops in counter 518 may be coupled to the output of the preceding flip-flops.

Additionally, the counter circuit 500 may include a full counter line 524 and a counter increment control circuit 502 coupled between the full counter line 524 and the counter 518. For example, the counter increment control circuit 502 may have an output 528 coupled to the clock line 534 of the first flip-flop (e.g., the flip-flip corresponding to the least significant bit) in the counter. In an example, the counter increment control circuit 502 may include an NOR gate, and an input of the NOR gate 510 may be coupled to an input 504, which is coupled to the output of the test circuit (e.g., test circuit 108 in FIG. 1, test circuit 282 in FIG. 2, or test compression logic 304 in FIG. 3). For example, the output of the test circuit may be a single bit, which changes from a logic zero to a logic one at input 504 when an error occurs in the test circuit. This may cause the output of counter increment control circuit 502 to turn from logic zero to logic one, causing the counter 518 to increment.

Additionally, an input 526 of the counter increment control circuit 502 may be coupled to the full counter line. When the counter has reached a counter full state, for example, all bits of the count value are at logic high (e.g. logic one), the full counter line may be set to a full state, for example, a logic high, e.g., logic one, causing the NOR gate of the counter increment control circuit 502 to ignore (effectively bypass) the output of the test circuit, and always set the output 528 to be logic zero. This subsequently causes the counter 518 to stop counting and maintain at the previous count value.

Now, returning to FIG. 5, configuration of the full counter line is further explained. In some scenarios, counter circuit 500 may include a full counter circuit 521 coupled between the output of the counter 532 and the full counter line 524. Full counter circuit 521 may have input data lines 530 that correspond to the output of the counter 532. Full counter circuit 521 may include one or more logic gates, such as multiple NAND gates 520 and a logic NOR gate 522. Each of the logic NAND gates 520 may have multiple inputs, such as 2, 4 or other numbers, each input corresponds to one bit of the output of the counter. When the count value has reached the counter full state, e.g., all 16 bits are at logic one, the full counter line 524 may change to a logic high state, e.g., logic one, to cause the counter increment control circuit 502 to disable the counter 518. This will prevent the counter from re-counting from zero, thus the last count value is preserved. When the count value has not reached the counter full state (e.g., at least one bit is logic zero), then the full counter line 524 may stay at logic low, e.g., logic zero, and the counter will not be affected.

Additionally, and/or alternatively, the counter circuit 500 may also include a one or more reset lines, such as a power up reset line 506 or test reset line 508. In some scenarios, the power up reset line 506 changes its logic state (e.g., from logic zero to logic one) when the power of the memory is up during a boot-up period. The test reset line 508 may change state (e.g., from logic zero to logic one) when the test is complete or when a user intervenes to end the test. The reset lines 506, 508 may be coupled to each flip flop in the counter 518 via one or more logic gates 514, e.g., a NOR gate, to reset the state of each flip flop.

Figure 6:
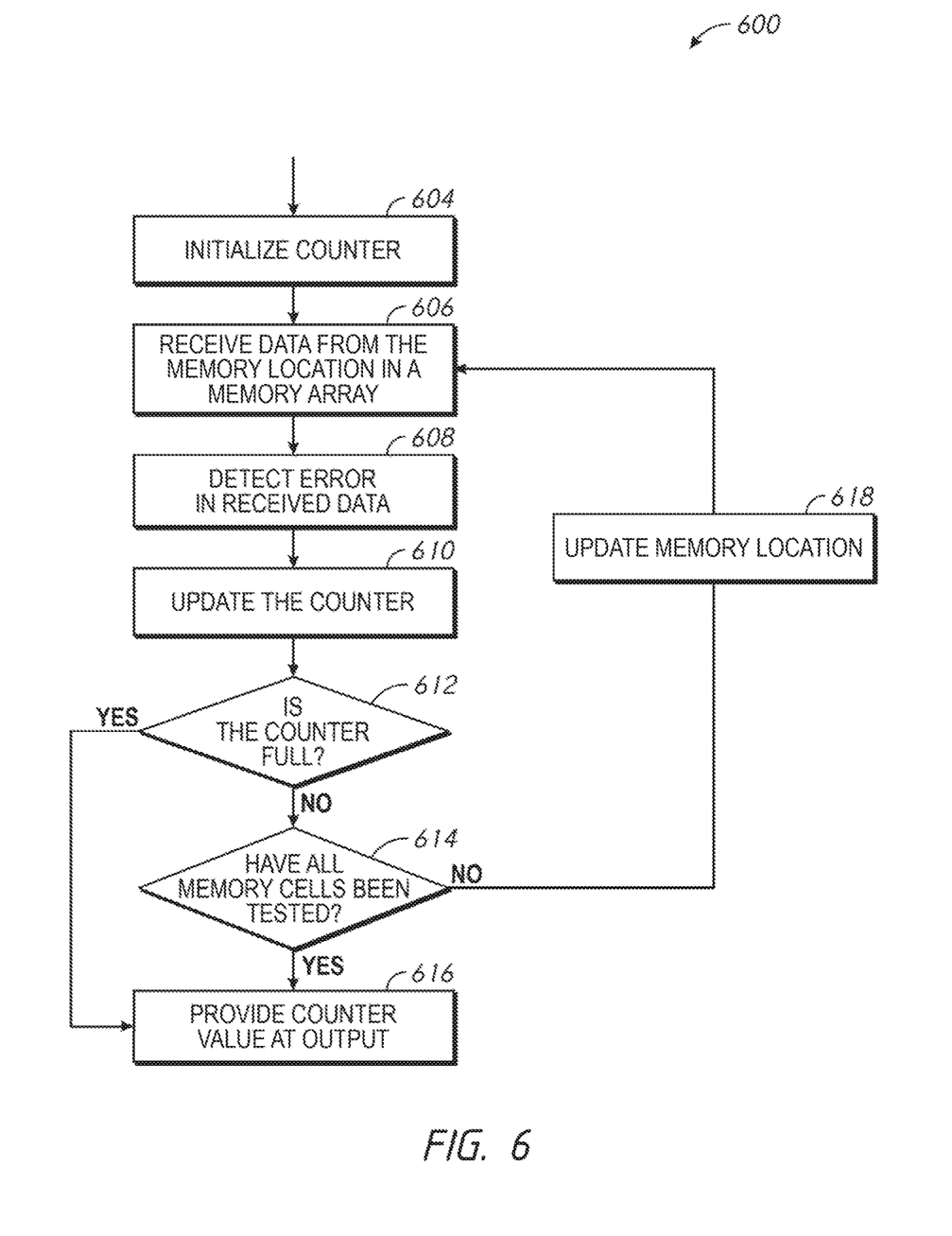
FIG. 6 illustrates a diagram of an example of a process in accordance with some examples disclosed herein.

Various methods may be implemented in the embodiments described with reference to FIGS. 1-5. FIG. 6 illustrates a diagram of an example of a method 600 for outputting an error count value in a memory test operation in accordance with some examples disclosed herein. The method 600 may be performed by the counter circuit 110 of FIG. 1, the counter circuit 280 of FIG. 2, the counter circuit 306 of FIG. 3, the counter circuit 500 of FIG. 5, or combinations thereof. The method 600 may include initializing a counter circuit, at 604, and receiving data from a memory location in a memory array, at 606. The method 600 may further include detecting errors in the received data, at 608, and updating the counter, at 610, in response to detection of an error in the data. For example, the method 600 may including comparing the received data, e.g., by using multiple logic gates such as using a compression circuit, to detect whether there is error in the received data. Updating the counter, at 610, may include incrementing the counter or keeping the count value unchanged. For example, if an error is detected, the method may increment the counter by one; otherwise, the count value remains the same. The method 600 may further update memory location, at 618 and iteratively repeat the steps 606, 608, 610, each time with an updated memory location, until all memory cells have been tested, at 614. Upon the memory test being complete, the method 600 may provide a value of the counter at an output, at 616. For example, the count value at the output of the counter circuit (e.g., output 532 in FIG. 5) may be received by a tester (e.g., tester 104 in FIG. 1) and displayed on a display of the tester (e.g., user interface 134 in FIG. 1). Additionally, and/or alternatively, when all memory cells have been tested, at 614, the method 600 may set the test reset line (e.g., test rest 508 in FIG. 5) to cause the counter to reset.

Additionally, and/or alternatively, at each iteration of the test, the method 600 may check whether the counter is full, at 612 (e.g., the counter has reached the counter full state). If the counter is full, the method may stop updating the counter and proceed to outputting the count value, at 616; otherwise, the memory test may continue. Additionally, and/or alternatively, in outputting the count value, the method 600 may include moving the count value to a data bus for reading out data. For example, the method 600 may move the count value to a data path that includes a multi-purpose register.

In some scenarios, in detecting the error in the received data, at 608, the method 600 may generate a fail/pass signal using a test compression circuit. In a non-limiting example, the test compression circuit (e.g., the test circuit 108 of FIG. 1, the test circuit 282 of FIG. 2, the test compression circuit 306 of FIG. 3, or the compression circuit 400 of FIG. 4) may output the fail/pass signal as a single bit line, which indicates whether the memory test for a given test run specific to a given location in the memory cell is successful. If the test is successful, the fail/pass signal may cause the counter to increment; otherwise, the count value may remain unchanged. According to various embodiments described in FIGS. 1-5, performing the compression test may use multiple logic gates, e.g., XOR gates, NOR gates, NAND gates, or a combination thereof, or other logic gates.

Figure 7:
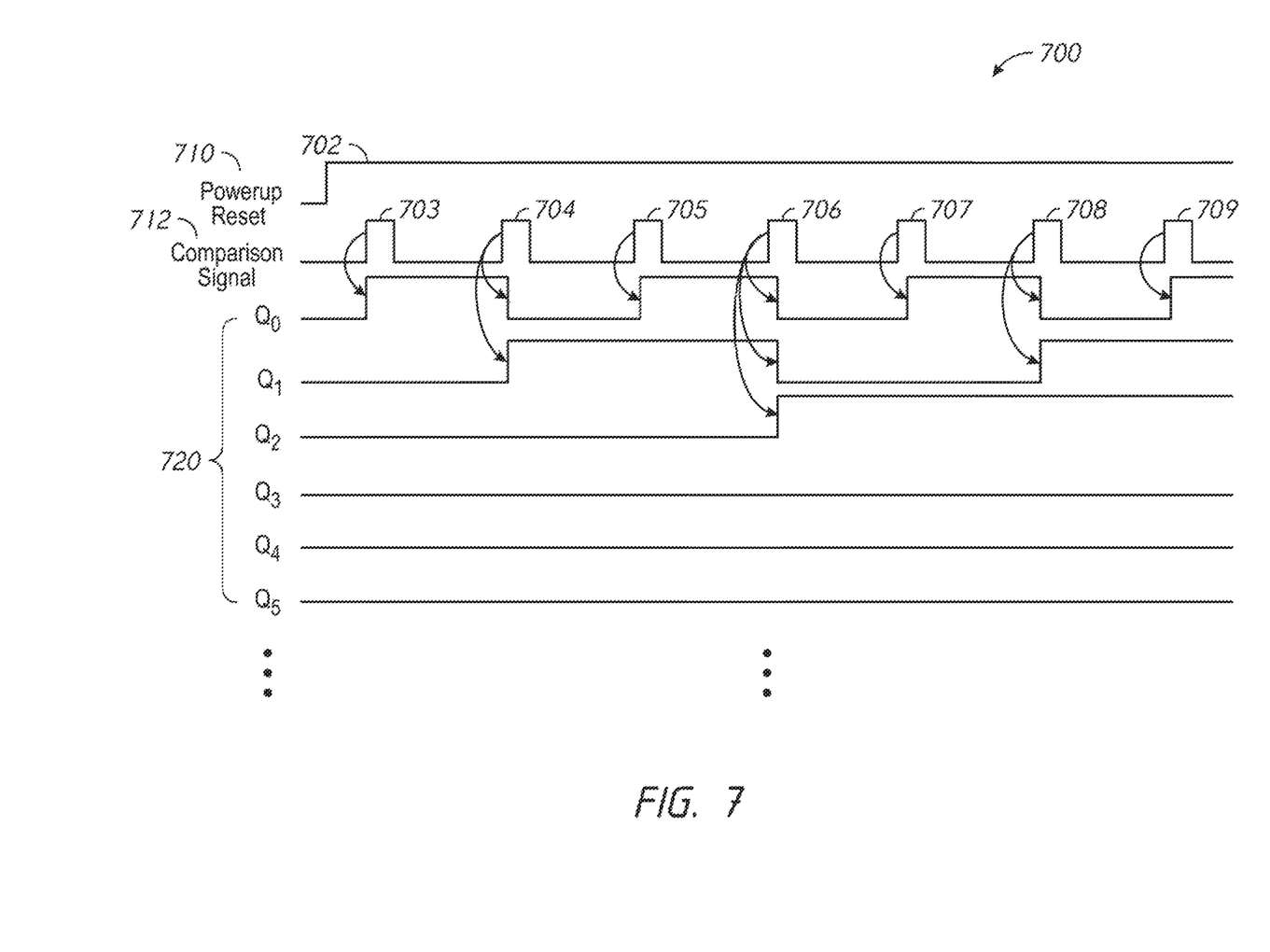
FIG. 7 illustrates a timing diagram of signals corresponding to a counter circuit in accordance with some examples disclosed herein.

FIG. 7 illustrates a timing diagram 700 of signals corresponding to a counter circuit (e.g., the counter circuit 110 of FIG. 1, the counter circuit 280 of FIG. 2, the counter circuit 306 of FIG. 3, the counter circuit 500 of FIG. 5, or combinations thereof) in accordance with some examples disclosed herein. In some scenarios, at the power up stage, the power up reset line 710 changes from logic zero to logic one 702. Each time an error is detected in the memory test, an error count signal 712 may generate a pulse, e.g., pulses 703-709. For example, the comparison signal may be a fail/pass signal generated by the test compression logic (e.g., the test circuit 108 of FIG. 1, the test circuit 282 of FIG. 2, the test compression logic 304 of FIG. 3). Each pulse in the error count signal 712 may cause the counter bits 720, e.g., Q0, Q1, Q2 . . . to update. For example, at the beginning of the test, all counter bits (e.g., count value) 720 are set to logic state zero. When a first error is received, pulse 703 causes Q0 to change state from zero to one. When the second error is detected, pulse 704 may cause Q0 to change state from logic one to logic zero and Q1 to change from logic zero to logic one. The counter bit lines 720 may represent a count value, for example, Q15, Q14, . . . , Q2, Q1, Q0 may represent a 16-bit value. In the instant example, as each error is detected, the counter bit lines Q2, Q1, Q0 may have the values at 000, 001, 010, 011, 100, 101, 110 and 111, which may represent no fail, one fail, two fails, three fails . . . , seven fails, respectively.

The various embodiments in FIGS. 1-7 may be advantageous over existing memory devices and systems in that detailed information, such as the count value that indicates the number of fails in the memory test, is provided. This information may indicate the robustness of the memory device. For example, a memory device may be categorized into different product grades, e.g., tier 1, tier 2, tier 3 based on the robustness of the memory. Based on the robustness of the memory device, a user may select to still use the memory even some errors occurred in the test. For example, if the count value is low, the errors in the memory may be corrected by an off-chip ECC. In other scenarios, the memory may be put to light use so that not all memory cells will be needed.

From the foregoing it will be appreciated that, although specific embodiments of the disclosure have been described herein for purposes of illustration, various modifications or combinations of various features may be made without deviating from the spirit and scope of the disclosure. For example, the compression circuit may be used for test time reduction. In other scenarios, the compression circuit may not be needed. In other scenarios, the test circuit may or may not produce false passes. The testing methods as disclosed herein may be performed at the final test step (e.g., the burn-in test) in fabrication a memory, but they may also be performed at other test stages. In some or other scenarios, count values may not be true number of memory bit fails but will be representative of the degree of errors in the memory. Further, in some scenarios, test data is uploaded into the memory, and the error count values may be generated without comparing the data to other external data sources. In other scenarios, a tester may receive the error count values and/or test comparison data and compare them with other benchmarks. Still further, the counter circuit may be configured to increment by one or other numbers each time an error is received. Additionally, and/or alternatively, the counter circuit may also set to a full value and decrease the count value each time the error occurs, in which case the counter full state is when all bits of the count value of the counter are logic zero. Accordingly, the disclosure is not limited except as by the appended claims.

What is claimed is:

1. An apparatus comprising:
   a memory array;
   a counter circuit coupled to a terminal and configured to, during a test operation, update a count value in response to detection of an error, the error is detected based on a comparison between a first block of data and a consecutively read second block of data from the memory array, and between the second block of data and a consecutively read third block of data from the memory array; and
   an input/output (I/O) circuit coupled to the counter circuit, wherein the I/O circuit includes a multiplexing circuit configured to provide the count value to a communication bus.

2. The apparatus of claim 1 further comprising a test compression logic coupled to the counter circuit and the multiplexing circuit, wherein the test compression logic is further configured to:
   for the detection of an error, detect one or more errors in the blocks of data from the memory array during the test operation; and
   provide test comparison data to the multiplexing circuit based on the one or more detected errors, wherein the test comparison data includes a pass/fail indication.

3. The apparatus of claim 2, wherein the test compression logic is further configured to provide one or more error signals to the counter circuit, each error signal corresponds to a respective error of the detected one or more errors.

4. The apparatus of claim 3, wherein the counter circuit comprises a counter configured to increment the count value responsive to each of the one or more error signals during the test operation.

5. The apparatus of claim 4, wherein the counter circuit further comprises a counter increment control circuit coupled to the counter and configured to provide a full count signal to the counter.

6. The apparatus of claim 5, wherein, responsive to the count value having reached a full count value, the counter increment control circuit is configured to provide the full count signal to cause the counter to maintain the count value.

7. The apparatus of claim 6, wherein the counter comprises a ripple counter and the full count signal is provided to a clock line of the counter.

8. The apparatus of claim 2, wherein the multiplexing circuit is configured to provide the test comparison data or the count value to the terminal responsive to a control signal.

* * * * *